(12) United States Patent
Shrowty et al.

(10) Patent No.: US 6,757,883 B1
(45) Date of Patent: Jun. 29, 2004

(54) ESTIMATING FREE SPACE IN IC CHIPS

(75) Inventors: Vikram Shrowty, Fremont, CA (US); Santhanakris Raman, Cupertino, CA (US)

(73) Assignee: LSI Logic Corporation, Milpitas, CA (US)

(*) Notice: Subject to any disclaimer, the term of this patent is extended or adjusted under 35 U.S.C. 154(b) by 22 days.

(21) Appl. No.: 10/316,594

(22) Filed: Dec. 11, 2002

(51) Int. Cl.[7] .............................................. G06F 17/50
(52) U.S. Cl. ........................................... 716/12; 716/8
(58) Field of Search ....................................... 716/12, 8

(56) References Cited

U.S. PATENT DOCUMENTS

| | | | |
|---|---|---|---|
| 4,468,728 A | * 8/1984 | Wang | 707/1 |
| 4,918,614 A | * 4/1990 | Modarres et al. | 716/10 |
| 5,625,564 A | 4/1997 | Rogoyski | 364/488 |
| 5,963,728 A | 10/1999 | Hathaway et al. | 395/500.04 |

OTHER PUBLICATIONS

"Improved Quadtree Algorithm Based on Joint Coding for Piecewise Smooth Image Compression" by R. Shukla et al., for the Swiss National Science Foundation, date unknown (4 pages).

Chip–Level CMP Modeling and Smart Dummy for HDP and Conformal CVD Films; 1999 CMP–MIC Conference; pp 120–127, Feb. 11–12, 1999;1999 IMIC–400P/99/0120— Author(s)—George Y. Liu, et al.

* cited by examiner

Primary Examiner—Matthew Smith
Assistant Examiner—Sun James Lin
(74) Attorney, Agent, or Firm—Westman, Champlin & Kelly

(57) ABSTRACT

Free space on a routed IC is estimated using expanding hierarchical search quadtrees or octrees. Nodes defining rectangular spaces of a layer are created in the tree. Definitions of polygons representing occupied space in the rectangular space are subtracted from a free-space polygon based on the rectangular space. A cost factor is identified for the node, and the process repeats with additional feature polygons until either the cost factor exceeds a maximum or no further feature polygons exist in the layer. If the cost factor exceeds the limit, the node is fractured into child nodes, each defining a quadrant of the parent rectangular space and each containing polygon definitions from the parent node. The process repeats until either the cost factor for each node is not greater than the limit or a dimension of the rectangular space of the node reaches a selected minimum. The nodes define free spaces, which are summed to identify the free space on the IC layer.

20 Claims, 2 Drawing Sheets

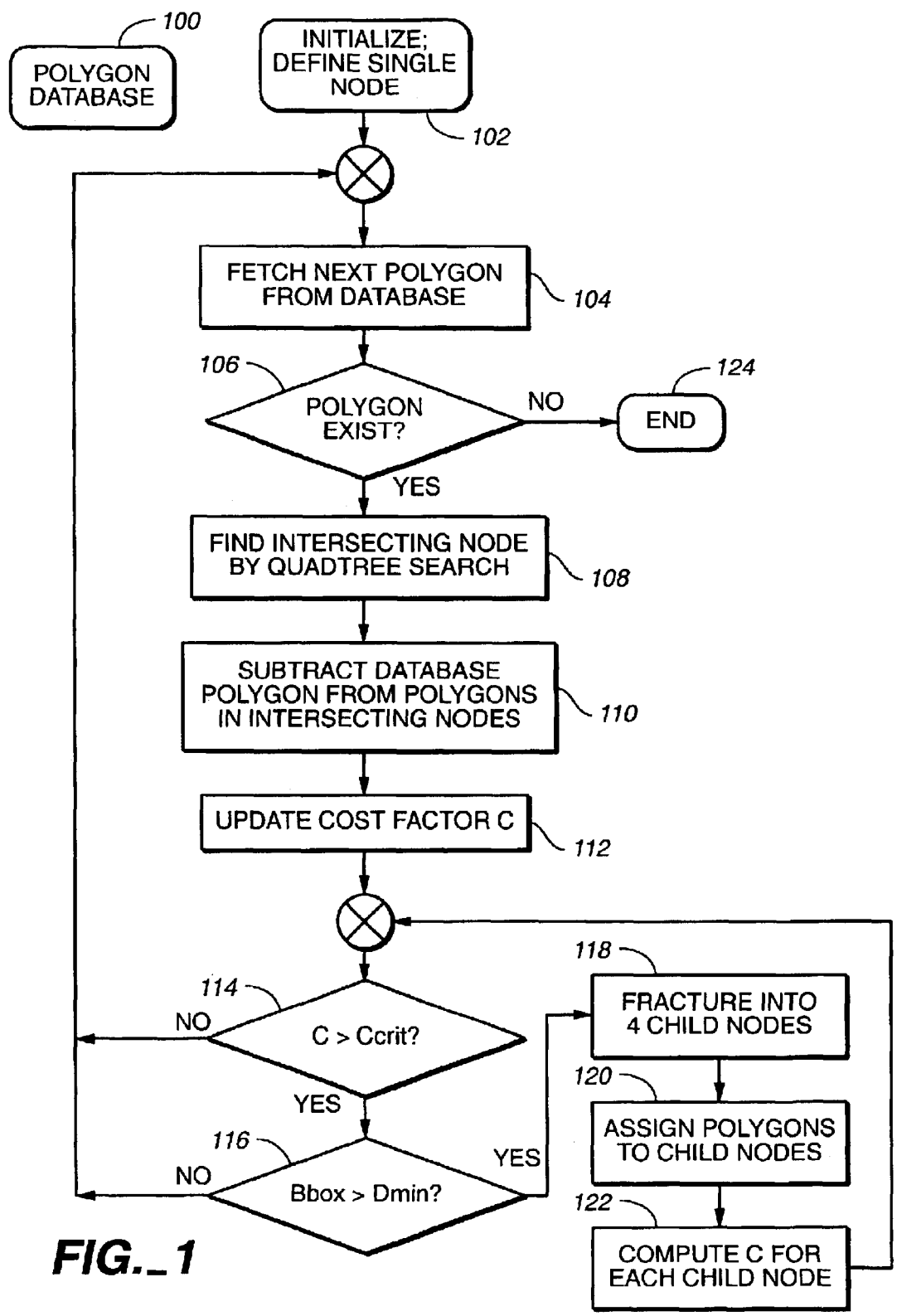
FIG._1

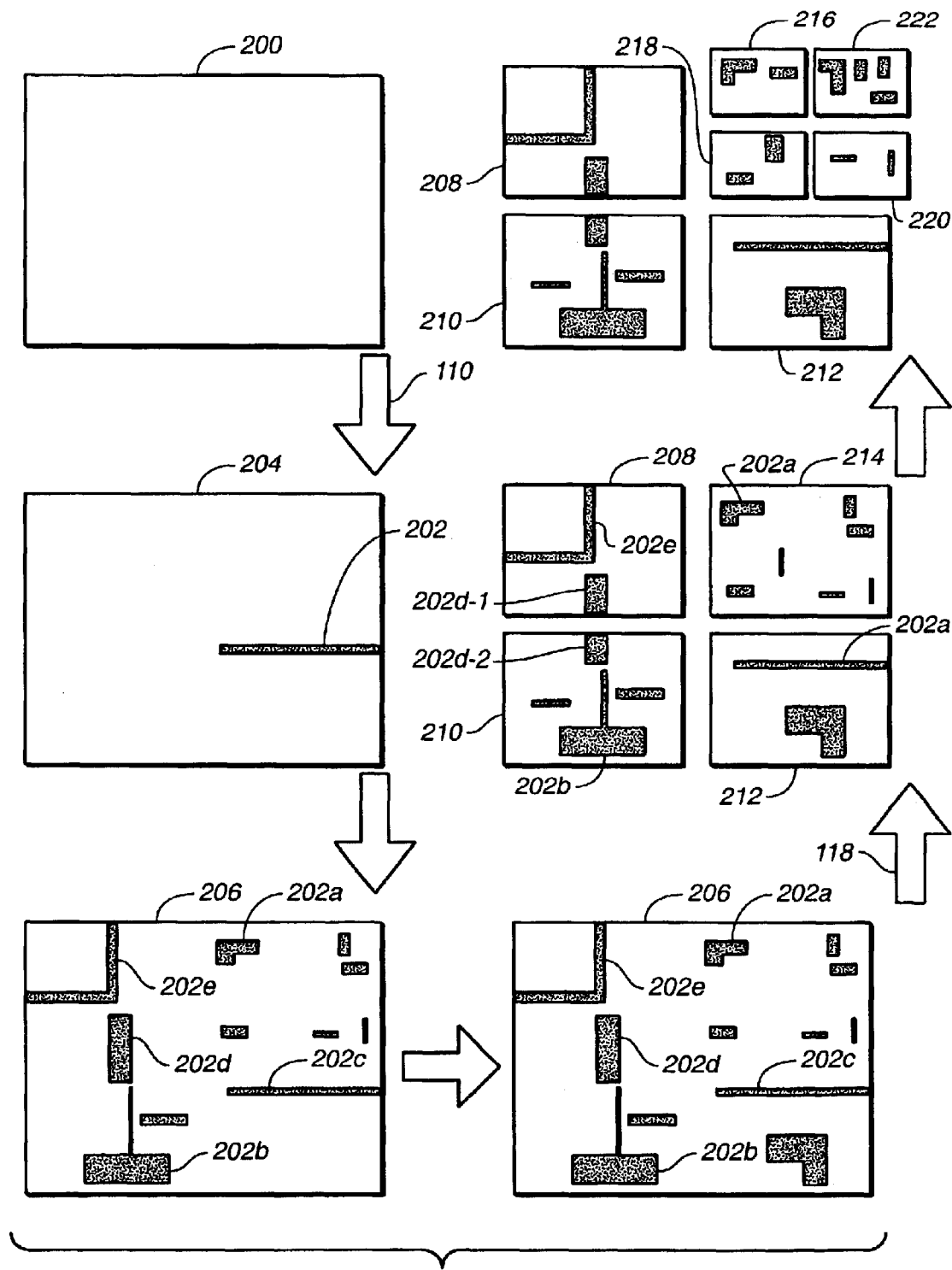
FIG._2

ESTIMATING FREE SPACE IN IC CHIPS

FIELD OF THE INVENTION

This invention relates to integrated circuit (IC) fabrication, and particularly to estimating free space in a routed design of an IC chip.

BACKGROUND OF THE INVENTION

Chip fabrication processes often require a uniform distribution of metal or polysilicon on layers of a chip. Metal wires and polysilicon features on a layer in a routed chip design are often concentrated in groups, leaving spaces on the layer. Consequently, material filling is a post-routing step in the chip design that requires that some of the unoccupied free space in the design be filled with "dummy" material to ensure a uniform distribution of the material over the layer. The distribution of dummy material requires identifying and storing representations of free space in the design.

Prior to the present invention, identification of free space on a layer of a routed IC design was accomplished by a grid-subtraction algorithm, which removed a grid location from a space if the grid location intersects a database object. Using the grid-subtraction algorithm, a uniform x-y grid of a layer of the routed design was created. Each grid cell was initially assumed to be a free-space cell representing a possible location for adding dummy metal. A database is created during chip design process, which defines polygons representing metal wires, pins, vias, etc. in the layout. The grid-subtraction algorithm operates on the polygons in the database to delete each free-space cell that intersects with a database polygon. Selection of the actual shape and location for metal filling is then determined from the grid coordinates of the free-space cells and the routed design.

One disadvantage of the grid-subtraction algorithm is that it is computationally intensive. More particularly, the uniform size of the grid cells usually resulted in numerous contiguous free-space grid cells. Contiguous cells could be merged, but merging is a computationally intensive operation. Alternatively, the plural contiguous free-space cells could be processed as individual cells, but that resulted in extensively long GDS2 files for the layout. Long GDS2 files require computationally intensive filling and design checking operations, and subsequent checking and fabrication operations are less efficient. Accordingly, there is a need for a process and apparatus for estimating free space on layers of a routed IC design that is more efficient and less computationally intensive and that is useful with polysilicon layers as well as metal layers.

SUMMARY OF THE INVENTION

A first embodiment of the invention is a process for estimating free space on a layer of a routed integrated circuit design. A hierarchical search tree, such as a quadtree or octree, contains nodes defining respective rectangular spaces on the layer of the design and polygons representing free space within the respective rectangular space. Feature polygons representing occupied space within the rectangular space are subtracted from the free space polygon in the tree node. The free spaces are summed to estimate the free space on the layer.

In some embodiments, a database defines the feature polygons on the layer. A first node is created in the search tree defining a rectangular space of the layer. Initially the free space polygon in the node is set equal to the rectangular space. Feature polygons from the database are considered sequentially such that if a polygon intersects a node of the tree, its definition is subtracted from the free space polygon defined by the node. A cost factor is identified for the node, and the process is repeated with additional polygons until either the cost factor exceeds a predetermined maximum value or no further polygons exist in the database.

In some embodiments, if the cost factor for a node exceeds the predetermined value, the node is fractured into child nodes, each defining a rectangular space that is a respective portion of the parent rectangular space. The tree recursively divides the rectangular space into quadrants, and the polygon definitions in the parent node are assigned to respective child nodes. The process is repeated for each child node until either the cost factor for each node is not greater than the predetermined maximum value or a dimension of the rectangular space of the child node reaches a predetermined minimum value.

A second embodiment of the invention is a computer readable program containing computer readable code that causes a computer to define a hierarchical search tree and carry out the processes of the invention on a database or file defining at least a layer of the routed integrated circuit chip.

BRIEF DESCRIPTION OF THE DRAWINGS

FIG. 1 is a flow chart of a process of estimating free space on layers of a routed IC design in accordance with the presently preferred embodiment of the present invention.

FIG. 2 illustrates the operation of the process illustrated in FIG. 1 on an IC layer layout.

DETAILED DESCRIPTION OF THE PREFERRED EMBODIMENTS

The present invention is directed to finding free space on metal and polysilicon layers in a fully routed chip design. While the invention is useful for either (or both) metal and polysilicon layers, it will be described in connection with a metal layer, such as for a process to find free space as candidates for metal filling. Those skilled in the art will recognize that the invention is equally applicable to polysilicon layers to find free space as candidates for polysilicon filling.

Each metal layer of a fully routed IC design can be considered as containing hundreds or even thousands of rectangular polygons of metal representing wires, pins, vias, etc. Free space on the metal layer is composed of that space not occupied by these polygons. The present invention is directed to estimating the free space in the design. Broadly, the present invention employs a data structure in the form of an expanding quadtree. A node of the tree corresponds to a rectangular space, defining a layer or a portion of a layer of the chip design. Initially, the entire space represented by the node is considered a free space. Polygons representing occupied space on the layer and which intersect the node are removed from the free space in the node. The free space of the layer is identified from the sum of the remaining rectangular spaces defined by the nodes.

A quadtree is a well-known hierarchical data structure, often used in image data compression. In the present invention, the data structure, in the form of nodes of the quadtree, corresponds to a rectangular area which may be subdivided or fractured into four child nodes, each corresponding to a quadrant of the parent node's rectangle. Each node includes data concerning the rectangle to which the node corresponds and identification of polygons that correspond to free space remaining within the rectangle. More particularly, the node data includes (i) a Bbox, which represents a bounding box rectangle (the rectangle to which the node corresponds), (ii) a Plist, which is a list of polygons representing free space within the node, and (iii) a computational cost factor, C.

FIG. 1 is a flowchart illustrating the process of estimating free space on a layer of an IC design. FIG. 2 illustrates images represented by data in nodes of an expanding quadtree during execution of the process of FIG. 1. The expanding quadtree is a hierarchical search tree implementing the data tracking structure of the present invention. The process begins at step 100 in FIG. 1 with a database containing a description of the fully routed IC design. At step 102, an expanding quadtree is created for the layer and is initialized with a single node containing the Bbox defining the bounding box rectangle equal to the size of the entire layer. The same rectangle is also inserted into the list of free-space polygons, Plist of the node. This data is symbolized in FIG. 2 as rectangle 200 representing the area of the entire layer under consideration. The cost factor, C, is initialized to zero.

At step 104, the design database 100 is queried for a feature polygon in the design. The polygon defines metal features (wires, vias, pins, etc.) occupying some rectangular space on the layer. If, at step 106, a feature polygon exists, then at step 108 the quadtree is searched to identify each node with which the polygon intersects. At step 110, the polygon in the database is subtracted from the polygons in the Plist for each of the intersecting nodes. More particularly, each free-space polygon of each intersecting node is checked for intersection with the feature polygon from database 100. If an intersection exists, the free-space polygon in the Plist is removed and replaced with one or more polygons resulting from the subtraction of the database polygon from the Plist polygon.

In FIG. 2, initially there is only one node and its Plist contains only polygon 200 representing that the entire layer is free space. A feature polygon 202 is found in the database and it intersects free-space polygon 200. Therefore, polygon 200 is removed from the Plist and replaced with free-space polygon 204, which contains additional vertices that represent the subtraction of polygon 202 from polygon 200.

In the execution of step 110, the feature polygon found in the design is checked for intersection with each rectangle in the Plist and is subtracted from the rectangle(s) with which it intersects. Initially, there is one node in the quad-tree, and it contains one rectangle in its Plist, namely the bounding box of the design. Since the first polygon found in the design database intersects with this rectangle, it is subtracted from the rectangle, and the rectangle is replaced by the polygon resulting from the subtraction. As the process iterates, this procedure is repeated for more feature polygons in the database, with each subtraction increasing the complexity (number of vertices) of the free-space polygon(s) remaining in the Plist. After processing a several feature polygons from the database, the free-space polygon(s) 200 (FIG. 2) in the Plist may become replaced by a free-space identifying polygon 206 containing multiple vertices representing several database polygons 202a, 202b, . . . .

At step 112, the computational cost factor, C, of processing a polygon from database 100 is updated. Initially, C=0. There are two principal factors that contribute to the computational cost of processing a polygon from the design database at a node, namely, (i) the complexity of the polygon(s) in the Plist, and ii) the length of the Plist. The cost factor of the node captures this computational cost:

$$C = (Function(Nav) + Klist) * Llist,$$

where Nav is the average number of vertices per polygon in the list, Klist is a constant representing the cost of list traversal per member, Llist is the length of the list and the Function is based on the algorithm used for the polygon subtraction operation. The value of the cost factor C is updated at step 112 after each successive polygon in the design has been subtracted. Each subtraction operation may increase the number of vertices, thereby increasing Nav, and/or the length of the list, Llist. Consequently, the value the cost factor, C, may increase with each subtraction operation.

At step 114, the calculated value of cost factor, C, is compared to a predetermined, user-defined critical cost factor, Ccrit. If C is greater than Ccrit, the size of the bounding box defined by the Bbox is compared to a predetermined, user-defined minimum dimension box, Dmin. If, at step 116 Bbox>Dmin, the node is fractured into four child nodes at step 118. The Bbox in each child node is set to the rectangle of one of the four equal-sized quadrants of the Bbox in the parent node. At step 120, each polygon in the Plist in the parent node is assigned to a child node's Plist based on the quadrant within which the polygon falls.

For example, free-space polygon 206 in FIG. 2 is fractured into four child nodes containing Plists defining free-space polygons 208, 210, 212 and 214. Definitions of feature polygons 202 in polygon 206 in the parent node are assigned to the child node polygons based on the quadrant within which the feature falls. Thus, feature polygon 202a from polygon 206 is placed in polygon 214 in the child node because feature polygon 202a is in the quadrant of polygon 206 corresponding to the child node containing polygon 214.

In the case of a feature polygon extending over two or more child node rectangles, such as feature polygon 202d, the polygon in parent node 200 is fractured along edges of the quadrant and the resulting polygons 208 and 210 will contain Plists defining respective portions 202d-1 and 202d-2 of feature 202d. Thus, each child node Bbox matches one of the four quadrants of the parent node rectangle, and its Plist contains the polygons defining the free space within the Bbox of the node.

At step 122, the cost factor C of each child node is computed. The process loops back to step 114 for the child nodes so that if any child node has a cost factor C greater than Ccrit, the fracture process is repeated through steps 116–122 on the child node. Thus, in FIG. 2, the child node containing a Plist defining polygon 214 is fractured into grandchild nodes containing Plists defining polygons 216, 218, 220 and 222. The process is recursively followed until either the value of C for all nodes drops to below Ccrit, or the Bbox of the node has reached the predetermined minimum value, Dmin. The process then loops back to step 104 to select another polygon from the database.

When the next feature polygon from the design database is to be processed, the leaf nodes (those nodes having no child nodes) whose Bboxes intersect with the polygon are found using the regular quad-tree search algorithm, and the feature polygon is then subtracted from the rectangles in the Plists of the intersecting node in the manner explained in connection with steps 106–122. When every polygon in the database for the layer has been processed, the process continues from step 106 to step 124. The remaining polygons in the Plist in each leaf node represent the free space for the rectangle of the node's Bbox. At step 124, the Plists of all leaf nodes are summed to define all of the free space in the layer.

In some embodiments, the process may then be repeated for each remaining metal layer, as well as for each polysilicon layer of the chip layout. It is preferred, however, that a hierarchical tree be constructed for each layer for which free space is to be located and that the database polygons are processed in the hierarchical trees for all affected layers of the design in parallel. The preferred technique permits a single pass through the database to identify all free space on affected layers.

While the invention has been described in connection with a 2-dimensional space, an analogous approach can be used for a 3-dimensional space. Instead of flat 2-dimensional polygons, the process would use representations of 3-dimensional solids, and each fracture would break the solid into a number of simpler solids using an expanding tree that is fractionable into a plurality of simple 3-dimensional parts. For example, an octree, or the like, could be used to fracture the solid into eight 3-dimensional simple parts. The number of simpler parts into which a given 3-dimensional node might be fractured may be any selected number based on the lengths of the sides of the parts and the complexity of the tree.

The grid-subtraction technique previously used to identify and fill free space on an IC layer used uniform-sized grid blocks to identify whether or not the block was free space. If a feature in the design database intersected only a part of a grid block, the entire grid block was identified as "occupied". As a result, free space within a grid block identified as "occupied" was not available for metal or polysilicon filling. While the resolution of the grid layout for the grid-subtraction technique might be increased to reduce the amount of free space falsely identified as occupied, the increased resolution also increased the amount of merging that might be required for filling purposes, and/or the length of the GSD2 file. The polygon subtraction technique of the present invention permits identification of maximal-sized free-space polygons meeting user-defined cost factors. Thus, the invention will create child nodes to define free space in small regions of a layer containing high concentrations of features, whereas other nodes define free space in large sparsely populated regions. Thus, the region defined by a node is dependent on the complexity of features in the region, not the size of the region.

With the present invention, GSD2 file length is minimized. The invention minimizes merging, minimizing computational costs by dividing nodes. Consequently, the time required to identify free space on a chip using a tool operating in accordance with the present invention is significantly reduced over that required by grid-subtraction algorithms requiring merging of cells, and the length of a GDS2 file for a chip processed in accordance with the present invention is significantly shorter than that for a chip processed using a grid-subtraction algorithm that does not merge cells.

The present invention provides a technique for estimating free space on a routed IC chip, which is more efficient and is less computational than prior tools. Additionally, the technique according to the present invention operates on polysilicon layers as well as metal layers, allowing for uniform distribution of both metal and polysilicon on respective layers of the chip. In preferred forms of the invention a computer readable program on a computer memory, such as a hard disk of a computer system, contains computer readable code that causes a computer to define the expanding hierarchical tree, such as a quadtree, octree, or the like, and to perform the processes herein described.

Although the present invention has been described with reference to preferred embodiments, workers skilled in the art will recognize that changes may be made in form and detail without departing from the spirit and scope of the invention.

What is claimed is:

1. A process for estimating free space on a layer of a routed integrated circuit design comprising steps of:

a) providing an expanding hierarchical search tree containing a plurality of nodes, each node containing data defining a respective geometric space on the layer and at least one free-space polygon representing free space within the respective geometric space; and b) subtracting a definition of a feature polygon on the layer from the free-space polygon in the node whose geometric space is intersected by the feature polygon.

2. The process of claim 1, wherein the search tree is an expanding search tree, the process further including steps of recursively c) dividing the geometric space defined by at least one selected node into portions, d) dividing the free-space polygon associated with the geometric space into child free-space polygons representing free space in the respective portion, e) creating child nodes of the selected nodes, and f) assigning each portion and a respective child free-space polygon to a respective child node.

3. The process of claim 2, further including steps of:

g) calculating a cost factor associated with each node, h) repeating steps b-g) for nodes whose cost factor exceeds a predetermined maximum until either no further feature polygons exist in the geometric space, or a dimension of the geometric space of the respective node reaches a predetermined minimum value.

4. The process of claim 1, wherein step a) further includes:

calculating a cost factor associated with each node, and wherein the process further includes:

c) repeating step b) with definitions of additional feature polygons representing occupied space in the geometric space until either the cost factor associated with a respective node exceeds a predetermined maximum value or no further feature polygons exist in the geometric space.

5. The process of claim 4, wherein for each node whose cost factor exceeds the predetermined value, further including steps of:

d) dividing the geometric space defined by the node into portions, e) dividing the free-space polygon associated with the geometric space into child free-space polygons representing free space in the respective portion, f) creating child nodes of the node, and g) assigning each portion and a respective child free-space polygon to a respective child node.

6. The process of claim 5, further including, for each child node:

h) repeating calculation of cost factors, and i) repeating steps d-g) for each child node whose cost factor exceeds the predetermined value.

7. The process of claim 1, further including:

c) providing a database defining at least one layer of the routed integrated circuit design, the database including definitions of feature polygons representing occupied space in the layer.

8. The process of claim 7, wherein step a) further includes:
   calculating a cost factor associated with each node,
   and wherein the process further includes:
   d) repeating step b) with definitions of additional feature polygons representing occupied space in the geometric space until either the cost factor associated with each node exceeds a predetermined maximum value or no further feature polygons exist in the geometric space.

9. The process of claim 8, wherein for each node whose cost factor exceeds the predetermined value, further including steps of:
   e) dividing the geometric space defined by the node into portions,
   f) dividing the free-space polygon associated with the geometric space into child free-space polygons representing free space in the respective portion,
   g) creating child nodes of the node, and
   h) assigning each portion and a respective child free-space polygon to a respective child node.

10. The process of claim 9, further including, for each child node:
    i) repeating calculation of cost factors, and
    j) repeating steps e-h) for each child node whose cost factor exceeds the predetermined value.

11. A computer usable medium having a computer readable program embodied therein for addressing data to cause a computer to estimate free space on a layer of a routed integrated circuit design, the computer readable program comprising:
    first computer readable program code for causing the computer to define an expanding hierarchical search tree containing a plurality of nodes containing data defining respective geometric spaces on the layer and at least one free-space polygon representing free space within the respective geometric space; and
    second computer readable program code for causing the computer to subtract a definition of a feature polygon on the layer from the free-space polygon in the node whose geometric space is intersected by the feature polygon.

12. The computer useable medium of claim 11, wherein the search tree is an expanding search tree, the computer readable program further including third computer readable program code for recursively causing the computer to
    a) divide the geometric space defined by at least one selected node into portions,
    b) divide the free-space polygon associated with the geometric space into child free-space polygons representing free space in the respective portion,
    c) create child nodes of the selected nodes, and
    d) assign each portion and a respective child free-space polygon to a respective child node.

13. The computer useable medium of claim 12, wherein the computer readable program further includes:
    fourth computer readable program code for causing the computer to calculate a cost factor associated with each node,
    fifth computer readable program code responsive to the cost factor for a node exceeding a predetermined maximum for causing the computer to repeat execution of the second, third and fourth computer readable program codes on the respective node until either no further feature polygons exist in the geometric space, or a dimension of the geometric space of the respective node reaches a predetermined minimum value.

14. The computer useable medium of claim 11, wherein the computer readable program further includes:
    third computer readable program code for causing the computer to calculate a cost factor associated with each node, and
    fourth computer readable program code for causing the computer to repeat execution of the second computer readable program code using definitions of additional feature polygons representing occupied space in the geometric space until either the cost factor associated with a respective node exceeds a predetermined maximum value or no further feature polygons exist in the geometric space.

15. The computer useable medium of claim 14, wherein the search tree is an expanding search tree, the computer readable program further including fifth computer readable program code for recursively causing the computer to
    a) divide the geometric space defined by at least one selected node into portions,
    b) divide the free-space polygon associated with the geometric space into child free-space polygons representing free space in the respective portion,
    c) create child nodes of the selected nodes, and
    d) assign each portion and a respective child free-space polygon to a respective child node.

16. The computer useable medium of claim 15, wherein the computer readable program further includes:
    computer readable program code for causing the computer to repeat execution of the third computer readable program code for each child node, and
    computer readable program code responsive to a child node cost factor exceeding the predetermined value for causing the computer to repeat execution of the fifth computer readable program code for the respective child node.

17. The computer useable medium of claim 11, wherein the computer readable program further includes:
    third computer readable program code for causing the computer to provide a database defining at least one layer of the routed integrated circuit design, the database including definitions of feature polygons representing occupied space in the layer.

18. The computer useable medium of claim 17, wherein the computer readable program further includes:
    fourth computer readable program code for causing the computer to calculate a cost factor associated with each node, and
    fifth computer readable program code for causing the computer to repeat execution of the second computer readable program code using definitions of additional feature polygons representing occupied space in the geometric space until either the cost factor associated with a respective node exceeds a predetermined maximum value or no further feature polygons exist in the geometric space.

19. The computer useable medium of claim 18, wherein the search tree is an expanding search tree, the computer readable program further including sixth computer readable program code for recursively causing the computer to
    a) divide the geometric space defined by at least one selected node into portions,
    b) divide the free-space polygon associated with the geometric space into child free-space polygons representing free space in the respective portion, c) create child nodes of the selected nodes, and
d) assign each portion and a respective child free-space polygon to a respective child node.

20. The computer useable medium of claim 19, wherein the computer readable program further includes:

computer readable program code for causing the computer to repeat execution of the fourth computer readable program code for each child node, and computer readable program code responsive to a child node cost factor exceeding the predetermined value for causing the computer to repeat execution of the sixth computer readable program code for the respective child node.

\* \* \* \* \*